(12) United States Patent
Chen

(10) Patent No.: US 11,404,452 B2
(45) Date of Patent: Aug. 2, 2022

(54) DISPLAY PANEL AND MANUFACTURING METHOD THEREOF

(71) Applicants: HKC CORPORATION LIMITED, Guangdong (CN); CHONGQING HKC OPTOELECTRONICS TECHNOLOGY CO., LTD., Chongqing (CN)

(72) Inventor: Yu-Jen Chen, Chongqing (CN)

(73) Assignees: HKC CORPORATION LIMI TED, Shenzhen (CN); CHONGQING HKC OPTOELECTRONICS TECHNOLOGY CO., LTD., Chongqing (CN)

(*) Notice: Subject to any disclaimer, the term of this patent is extended or adjusted under 35 U.S.C. 154(b) by 77 days.

(21) Appl. No.: 16/639,505

(22) PCT Filed: Dec. 13, 2017

(86) PCT No.: PCT/CN2017/115865
§ 371 (c)(1),
(2) Date: Feb. 14, 2020

(87) PCT Pub. No.: WO2019/033637
PCT Pub. Date: Feb. 21, 2019

(65) Prior Publication Data
US 2021/0028201 A1    Jan. 28, 2021

(30) Foreign Application Priority Data
Aug. 17, 2017 (CN) .......................... 201710705505.1

(51) Int. Cl.
*H01L 27/12* (2006.01)
*G02F 1/1335* (2006.01)
(Continued)

(52) U.S. Cl.
CPC ........ *H01L 27/1292* (2013.01); *G02F 1/1333* (2013.01); *G02F 1/1339* (2013.01);
(Continued)

(58) Field of Classification Search
CPC ........... H01L 27/1292; G02F 1/133516; G02F 1/1339; G02F 1/13398; G02F 1/133514; G02F 1/13394; G02F 1/1333
See application file for complete search history.

(56) References Cited

U.S. PATENT DOCUMENTS 5,976,734 A * 11/1999 Yamaguchi ....... G02F 1/133516
430/7
6,084,006 A * 7/2000 Kashiwazaki .......... C08L 63/00
106/31.27
(Continued)

FOREIGN PATENT DOCUMENTS

CN    104076557 A    10/2014
CN    104641295 A     5/2015
(Continued)

*Primary Examiner* — Ahmed N Sefer
(74) *Attorney, Agent, or Firm* — Muncy, Geissler, Olds & Lowe, P.C.

(57) ABSTRACT

A manufacturing method of a display panel comprises: providing a first substrate; forming active switches on the first substrate; providing a second substrate disposed opposite to the first substrate; forming a color filter layer on the first substrate or the second substrate; and forming at least one spacer unit on the first substrate or the second substrate. The spacer unit comprises a photosensitive spacer material comprising two different wavelengths of light initiators.

16 Claims, 4 Drawing Sheets

(51) Int. Cl.
*G02F 1/1339* (2006.01)
*G02F 1/1333* (2006.01)

(52) U.S. Cl.
CPC .... *G02F 1/13394* (2013.01); *G02F 1/133514* (2013.01); *G02F 1/133516* (2013.01); *G02F 1/13398* (2021.01)

(56) References Cited

U.S. PATENT DOCUMENTS

| | | | | |
|---|---|---|---|---|
| 6,501,527 B1* | 12/2002 | Hirose | ................ | G02F 1/13394 349/155 |
| 2003/0063244 A1* | 4/2003 | Fujimori | ........... | G02F 1/133371 349/113 |
| 2004/0112858 A1* | 6/2004 | Yang | ................... | G02F 1/13394 216/23 |
| 2004/0212765 A1* | 10/2004 | Kano | ................... | G02F 1/1333 349/114 |
| 2005/0157226 A1* | 7/2005 | Lan | .................. | G02F 1/133514 349/106 |
| 2005/0264749 A1* | 12/2005 | Lee | ....................... | G02F 1/1333 349/156 |
| 2006/0229376 A1* | 10/2006 | Hayashi | .................. | G03F 7/027 522/6 |
| 2007/0128548 A1* | 6/2007 | Kim | ....................... | G03F 7/0295 430/281.1 |
| 2010/0328599 A1* | 12/2010 | Kumashiro | ......... | G02F 1/13394 349/156 |
| 2012/0242939 A1* | 9/2012 | Li | ....................... | G02F 1/13394 349/106 |
| 2012/0262653 A1* | 10/2012 | Shimizu | ............ | G02F 1/133707 349/106 |
| 2015/0123100 A1* | 5/2015 | Lee | ..................... | H01L 51/0558 257/40 |
| 2016/0327825 A1* | 11/2016 | Tomiyasu | ......... | G02F 1/133345 |
| 2018/0046033 A1* | 2/2018 | Park | ................... | C09K 19/3001 |

FOREIGN PATENT DOCUMENTS

| | | | |
|---|---|---|---|
| CN | 106773345 A | 5/2017 | |
| CN | 107329331 A | 11/2017 | |

* cited by examiner

| solvent | 60%~80% | |
|---|---|---|
| adhesive | 10%~20% | |
| monomer | 10%~15% | |
| oligomer | <1% | |
| light initiator | long wavelength | 2%~4% |
| | short wavelength | 1% |
| additive | <1% | |

DISPLAY PANEL AND MANUFACTURING METHOD THEREOF

BACKGROUND

Technical Field

This disclosure relates to a technical field of a display, and more particularly to a display panel and a manufacturing method thereof.

Related Art

The display has many advantages, such as the slim body, the power-saving property, the radiation less property and the like, and has been widely used. Most of the displays in the existing market are backlight displays, which include a display panel and a backlight module. The working principle of the display panel is to refract the light rays from the backlight module to produce a frame by placing liquid crystal molecules in two parallel substrates, and by applying a driving voltage to the two substrates to control the orientations of the liquid crystal molecules.

A thin film transistor-liquid crystal display (TFT-LCD) has the low power consumption, excellent frame quality and high production yield and other performances, and has now gradually occupied the dominant position in the display field. Similarly, the TFT-LCD includes the display panel and the backlight module. The display panel includes a color filter substrate (CF substrate, also referred to as a color filter substrate) and a thin film transistor substrate (TFT substrate), and the transparent electrode is present on the opposite inner sides of the above-mentioned substrates. A layer of liquid crystal (LC) molecules is disposed between the two substrates. The display panel can provide an electric field to control the orientation of the liquid crystal molecules for changing the polarization of light, and the polarizer is configured to allow the polarized light to pass through or be blocked, thereby achieving the display function.

In the current display panel industry, the process reproduction test often needs to be performed in order to produce the spacer unit with the good height. After several times of mask transmittance corrections or process exposure energy adjustments, the controlled better height of the spacer unit is obtained, and the associated testing cost or mask development cost is wasted.

SUMMARY

The technical problem to be solved by this disclosure is to provide a low-cost display panel.

In addition, the disclosure also provides a manufacturing method of a display panel.

To achieve the above, the disclosure provides a manufacturing method of a display panel, comprising: providing a first substrate; forming active switches on the first substrate; providing a second substrate disposed opposite to the first substrate; forming a color filter layer on the first substrate or the second substrate; and forming at least one spacer unit on the first substrate or the second substrate. The spacer unit comprises a photosensitive spacer material comprising two different wavelengths of light initiators.

In one embodiment, the photosensitive spacer material comprises solvent, adhesive, monomer, oligomer, light initiator, and additive.

In one embodiment, a component ratio of the solvent is 60%~80%.

In one embodiment, a component ratio of the adhesive is 10%~20%.

In one embodiment, a component ratio of the monomer is 10%~15%.

In one embodiment, the monomer comprises a photoactive monomer.

In one embodiment, the photoactive monomer is an acrylic polymer or an epoxy polymer.

In one embodiment, a component ratio of the oligomer is less than 1%.

In one embodiment, the light initiator comprises a long wavelength light initiator and a short wavelength light initiator, a component ratio of the long wavelength light initiator is 2%~4%, and a component ratio of the short wavelength light initiator is 1%.

In one embodiment, a component ratio of the additive is less than 1%.

In one embodiment, the additive comprises one or multiple of activator, antioxidant, deflocculant, dispersant, leveling agent, or stabilizer.

According to another aspect of the disclosure, the disclosure also discloses a display panel. The display panel comprises a first substrate, a second substrate and a color filter layer. Active switches are disposed on the first substrate, the second substrate is disposed opposite to the first substrate, and the color filter layer is disposed on the first substrate or the second substrate. At least one spacer unit is formed on the first substrate or the second substrate, and the spacer unit comprises a photosensitive spacer material comprising two different wavelengths of light initiators.

According to still another aspect of the disclosure, the disclosure also discloses a manufacturing method of a display panel, comprising: providing a first substrate; forming active switches on the first substrate; providing a second substrate disposed opposite to the first substrate; forming a color filter layer on the first substrate or the second substrate; and forming at least one spacer unit on the first substrate or the second substrate. The spacer unit comprises a photosensitive spacer material comprising two different wavelengths of light initiators. The photosensitive spacer material comprises solvent, adhesive, monomer, oligomer, light initiator, and additive. A component ratio of the solvent is 60%~80%, a component ratio of the adhesive is 10%~20%, a component ratio of the monomer is 10%~15%, and a component ratio of the oligomer is less than 1%.

Because the photosensitive spacer material including two light initiators is adopted to manufacture the spacer unit, it is possible to adjust and control the shape and the size of the spacer unit by adjusting to reduce the exposure energy without wasting the production cost of the mask under the half-tone mask conditions of different transmittance values. The precise transmittance design value can be obtained while the exposure energy can be controlled. The process production time can be effectively shortened and the testing cost can be decreased to better increase the production capacity and output of the display panel, thereby effectively simplifying the production process of the display panel, and obtaining the better production efficiency of the display panel. In addition, the height and the shape of the spacer unit can be precisely controlled by precisely controlling the exposure energy and the illumination transmission to further enhance the high precision specification of the spacer unit, ensure the more precise height and the top and bottom areas of the spacer unit and the better elastic recovery percentage, thus better hold the better uniformity of the inter-box gaps, better decrease the light-leakage condition of the display panel, and further enhance the contrast ratio of the display panel.

DETAILED DESCRIPTION OF THE INVENTION

Figure 1:
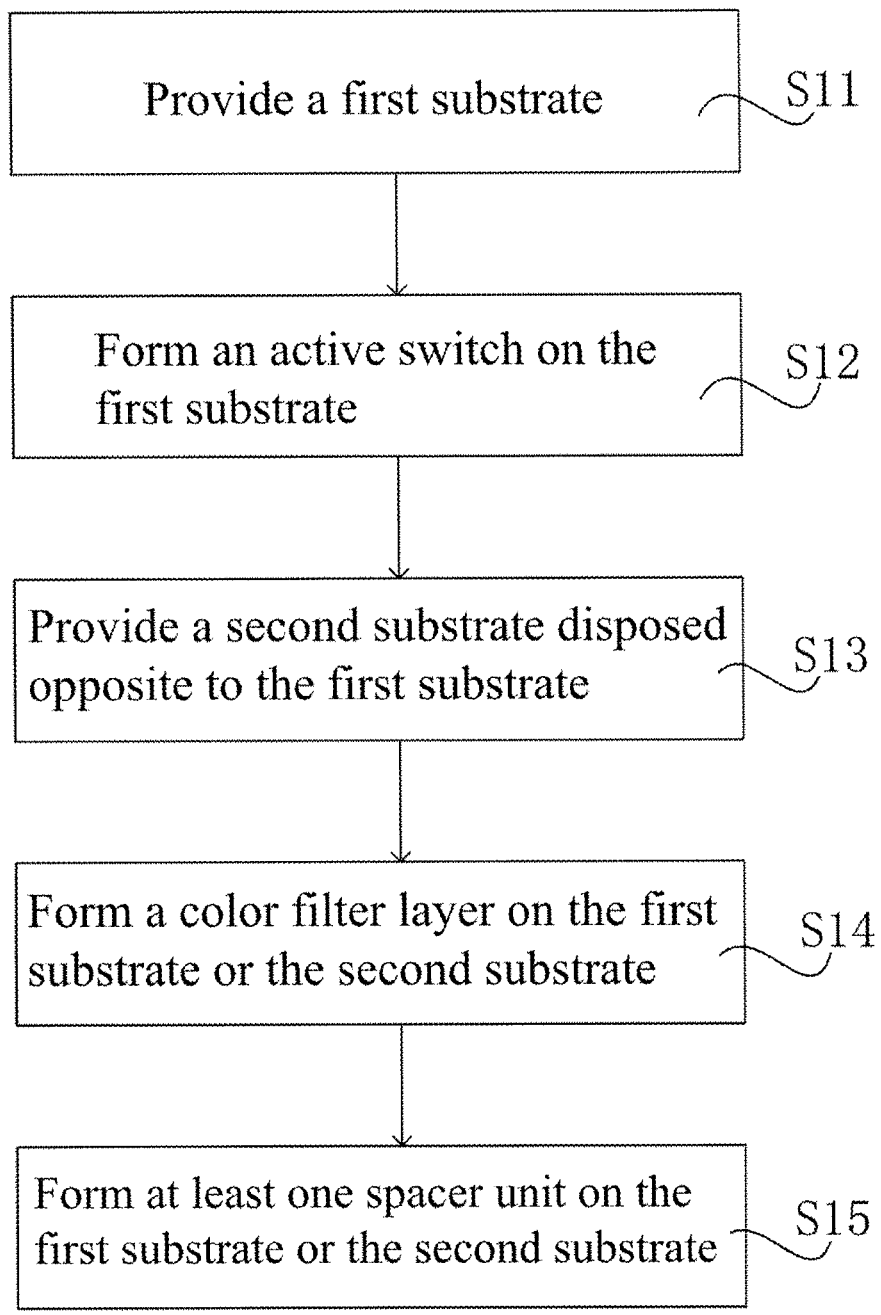
FIG. 1 is a flow chart showing a manufacturing method of a display panel according to an embodiment of this disclosure.

Specific structures and function details disclosed herein are only for the illustrative purpose for describing the exemplary embodiment of this disclosure. However, this disclosure can be specifically implemented through many replacements, and should not be explained as being restricted to only the embodiment disclosed herein.

In the description of this disclosure, it is to be understood that the terms "center", "transversal", "up," "down," "left," "right," "vertical", "horizontal", "top," "bottom," "inside" and "outside" indicating the orientation or position relationships are the orientation or position relationships based on the drawing, are only provided for the purposes of describing this disclosure and simplifying the description, but do not indicate or imply that the directed devices or elements must have the specific orientations or be constructed and operated in the specific orientations, and thus cannot be understood as the restriction to this disclosure. In addition, the terms "first," and "second" are used for the illustrative purpose only and cannot be understood as indicating or implying the relative importance or implicitly specifying the number of indicated technical features. Therefore, the features restricted by "first" and "second" may expressly or implicitly comprise one or multiple ones of the features. In the description of this disclosure, unless otherwise described, the meaning of "multiple" comprises two or more than two. In addition, the terms "comprises" and any modification thereof intend to cover the non-exclusive inclusions.

In the description of this disclosure, it needs to be described that, unless otherwise expressly stated and limited, the terms "mount," "link" and "connect" should be broadly understood. For example, they may be the fixed connection, may be the detachable connection or may be the integral connection; may be the mechanical connection or may also be the electrical connection; or may be the direct connection, may be the indirect connection through a middle medium or may be the inner communication between two elements. It will be apparent to those skilled in the art that the specific meanings of the above terms in this application may be understood according to the specific conditions.

The terms used herein are for the purpose of describing only specific embodiments and are not intended to limit the exemplary embodiments. Unless the contexts clearly indicate otherwise, the singular form "one," "a" and "an" used here further intend to include plural forms. It should also be understood that the terms "comprising" and/or "including" are used herein to describe the features to describe the presence of stated features, integers, steps, operations, units and/or elements without excluding the presence or addition of one or more other features, integers, steps, operations, units, elements, and/or combinations thereof.

This disclosure is further described below with reference to the accompanying drawings and examples.

The inventor further studies to find that the process reproduction test often needs to be performed in order to produce a spacer unit 5 with the good height. After several times of mask transmittance corrections or process exposure energy adjustments, the controlled better height of the spacer unit 5 is obtained, and the associated testing cost or mask development cost is wasted. Thus, the inventor provides a new technical solution capable of effectively saving the cost of the display panel.

As shown in FIG. 1, a manufacturing method of a display panel is provided. The display panel includes a substrate 1 and a color filter layer 6 disposed on the substrate 1. The manufacturing method includes the following steps.

In a step S11, a first substrate is provided.

In a step S12, an active switch is formed on the first substrate.

In a step S13, a second substrate disposed opposite to the first substrate is provided.

In a step S14, a color filter layer is formed on the first substrate or the second substrate.

In a step S15, at least one spacer unit is formed on the first substrate or the second substrate.

The spacer unit includes a photosensitive spacer material including two different wavelengths of light initiators.

Because the photosensitive spacer material including two light initiators is adopted to manufacture the spacer unit 5, it is possible to adjust and control the shape and the size of the spacer unit 5 by adjusting to reduce the exposure energy without wasting the production cost of the mask under the half-tone mask conditions of different transmittance values. The precise transmittance design value can be obtained while the exposure energy can be controlled. The process production time can be effectively shortened and the testing cost can be decreased to better increase the production capacity and output of the display panel, thereby effectively simplifying the production process of the display panel, and obtaining the better production efficiency of the display panel. In addition, the height and the shape of the spacer unit 5 can be precisely controlled by precisely controlling the exposure energy and the illumination transmission to further enhance the high precision specification of the spacer unit 5, ensure the more precise height and the top and bottom areas of the spacer unit 5 and the better elastic recovery percentage, thus better hold the better uniformity of the inter-box gaps, better decrease the light-leakage condition of the display panel, and further enhance the contrast ratio of the display panel. The substrate 1 may be selected as a color filter substrate or an array substrate, a transparent electrode layer is disposed on the color filter substrate or the array substrate, a photosensitive spacer material including two different wavelengths of light initiators is disposed on the transparent electrode layer, and the photosensitive spacer material is processed using the mask process to obtain the spacer unit.

The mask adopts a multi-gray scale mask, which may be divided into a half-tone mask and a gray-tone mask. Regarding the gray-tone mask, a micro seam lower than the resolution of the exposure machine is formed, and then the micro seam obstructs a portion of the light source to achieve the half-exposure effect. On the other hand, the half-tone mask utilizes the semi-permeable membrane to perform the half-exposure. Because the above-mentioned two methods can present three exposure levels including the exposure portion, the half-exposure portion and the non-exposure portion after one exposure process, the photosensitive material layer with two thicknesses can be formed after the development. According to the thickness difference of the photoresist, the pattern can be transferred to the substrate 1 using the fewer masks than the ordinary condition, and the production efficiency of the panel can be enhanced. The multi-gray scale mask uses the fewer masks than the ordinary condition and can transfer the pattern to the material layer, the multi-gray scale mask of the panel process can be shortened, and the production efficiency of the panel can be enhanced. In addition, because the halftone can be present, the display quality of the display panel can be enhanced.

Figures 2, 3:
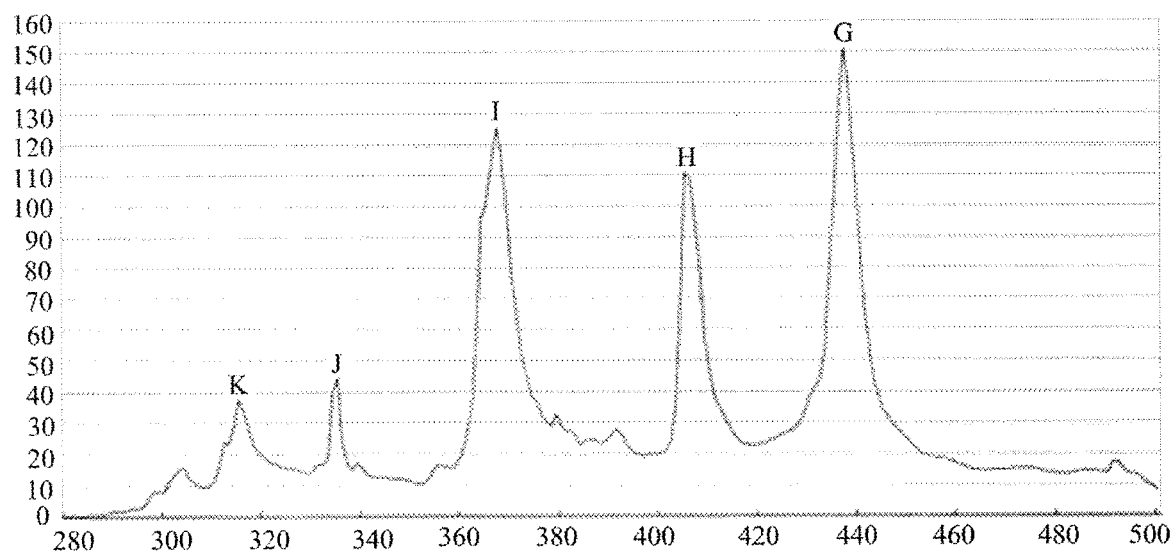
FIG. 2 shows compositions and component ratios of a photosensitive spacer material according to the embodiment of this disclosure.
FIG. 3 is a schematic view showing a frequency spectrum of an exposure machine according to the embodiment of this disclosure.

As shown in FIG. 2, the photosensitive spacer material comprises solvent, adhesive, monomer, oligomer, light initiator, and additive.

The solvent can be one or multiple of propylene glycol monomethyl ether, cyclohexane, butyl carbitol and butyl carbitol acetate. Optionally, the solvent is propylene glycol methyl ether acetate (PGMEA). A component ratio of the solvent is 60%~80%. The solvent comprises esters, ethers, aliphatic hydrocarbons, or aromatic hydrocarbons, such as fatty alcohols, glycol ethers, ethyl acetate, methyl ethyl ketone, cyclohexane, propylene glycol monomethyl ether, propylene glycol monomethyl ether acetate, or xylene. Optionally, the solvent of this disclosure can be one or multiple of propylene glycol monomethyl ether, cyclohexane, butyl carbitol and butyl carbitol acetate. The viscosity of the above organic solvent can be adjusted for performing the photoresist coating process.

In one embodiment, the adhesive is styrene monomer, and a component ratio of the adhesive is 10%~20%.

The monomer comprises a photoactive monomer, and the photoactive monomer is an acrylic polymer or an epoxy polymer. Specifically, the solvent can be one or multiple of acrylic resin, bisphenol A type epoxy acrylate, copolymer of methacrylic resin and styrene, polymer of pentaerythritol tetrakis-(trithiopropionate) and triallyl isocyanurate, silicone alkane resin. The photoactive monomer comprises an acrylic polymer and/or an epoxy polymer. There two monomers can be individually used or used together. Vinyl ether monomer can adjust the viscosity of the cured system, and can participate in the cationic polymerization reaction, thereby effectively improving the antioxidant property of the cured system. Vinyl ether monomers may include hydroxybutyl vinyl ether, hydroxybutyl vinyl alcohol, triethylene glycol divinyl ester, and 2-ethylhexyl vinyl ether. The vinyl ether monomer can be one or multiple of hydroxybutyl vinyl ether, hydroxybutyl vinyl alcohol, triethylene glycol divinyl ester and 2-ethylhexyl vinyl ether. Acrylate monomers contain difunctional or polyfunctional groups. The bifunctional acrylate monomer is one or multiple selected from 1,6-hexanediol diacrylate, dipropylene glycol diacrylate, tripropylene glycol diacrylate, tetraethoxylated bisphenol A diacrylate, methoxypolyethylene glycol monomethacrylate, and polyethylene glycol dipropionate. The polyfunctional acrylate monomer is one or multiple selected from trimethylolpropane triacrylate, pentaerythritol triacrylate, pentaerythritol tetraacrylate, dipentaerythritol pentaacrylate, dipentaerythritol hexaacrylate, ditrimethylolpropane tetraacrylate, ethoxylated trimethylolpropane triacrylate 2, and propoxylated glycerol triacrylate. The photoactive monomer is a polyfunctional group monomer containing two or more unsaturated double bond compounds, which can generate polymerization and cross-link reaction under photoinitiators. A component ratio of the monomer is 10%~15%.

The above photoactive monomers may be individually used or used in combination of two or more kinds. Optionally, the photoactive monomer can be selected from one or multiple of hydroxybutyl vinyl ether, pentaerythritol tetraacrylate, hydroxybutyl vinyl alcohol, and methoxypolyethylene glycol monomethacrylate. The photoactive monomer can also be a composition of hydroxybutyl vinyl ether and pentaerythritol tetraacrylate, or a composition of hydroxybutyl vinyl alcohol, pentaerythritol tetraacrylate and methoxypolyethylene glycol monomethacrylate. When a variety of materials are mixed, their proportions can be adjusted according to the needs of exposure time.

In one embodiment, the oligomer comprises functional monomers such as propoxylatedtrimethylol propane triacrylate, and the component ratio of the oligomer is less than 1%.

The light initiator comprises one or multiple of acetophenones, acylphosphine oxides, aromatic ketones, aromatic sulfonium salts, iodonium salts and ferrocene salts. The light initiator comprises a long wavelength light initiator and a short wavelength light initiator. The light initiator can excite the photoresist to form a free radical or ion active group under lighting or heating for triggering intermolecular cross-linking reaction. The pigment particle size, particle size distribution, particle shape, surface polarity, particle aggregation state and chemical property of the light initiator can affect the final properties of the photoresist. Optionally, the light initiator of this disclosure is one or multiple selected from acyl phosphorous oxide, benzoin ether, benzoin dimethyl ether, didodecylbenzene iodonium salt, thiophenyl mono-oxazinone, Irgacure 500, and Gencure 907. A component ratio of the long wavelength light initiator is 2%~4%, and a component ratio of the short wavelength light initiator is 1%.

In one embodiment, the additive is one or multiple of activator, antioxidant, deflocculant, dispersant, leveling agent, and stabilizer. The stabilizer is selected from one or multiple of hydroquinone, methoxy-p-cresol, p-benzoquinone, and 2,5-di-tert-butylhydroquinone. The dispersant is a polymer compound configured for dispersing the pigment, and includes polyacrylics, styrene-maleic anhydride half esters, styrene-acrylic acid copolymers, or the likes. The dispersant can provide the functions of wetting, dispersing, anti-coagulation, stabling dispersion system, and reducing viscosity. The dispersant of this disclosure is selected from one or multiple of amide-based polymers, modified polyurethane polymers, pigment-group-containing high molecular block copolymers, polyether-modified dimethylpolysiloxane copolymers, silicone surfactants, polyurethane, and modified polyacrylate. The additive comprises TA-100, BYK160, 161, 163, 170, 2000, 2001 series, EFKA46, 47, 452 series, or EFKAPolymer400, 403, 64 series. The component ratio of the additive is less than 1%.

As shown in FIG. 3, through the information of the frequency spectrum of the exposure machine, the wavelength adjustment of the light initiator of the material is performed in the J to K wavelength areas (the photosensitive spacer material mainly absorbs the wavelength ranging from 300 to 350 nm). The long wavelength initiator has the longer wavelength, so the energy is lower in a short period of time, and the shape of the top area of the photosensitive spacer material can be uniformly controlled. The short wavelength initiator has the shorter wavelength, so the energy is higher in a short period of time, and the shape of the bottom area of the photosensitive spacer material can be uniformly controlled. Meanwhile, the long and short wavelengths are summated (with different weighting ratios), and the applicable wavelength of the exposure machine can be controlled so that the exposure energy is controlled within a predetermined range, and the range of the exposure energy controlled by the frequency spectrum of the exposure machine is reduced.

Figure 4:
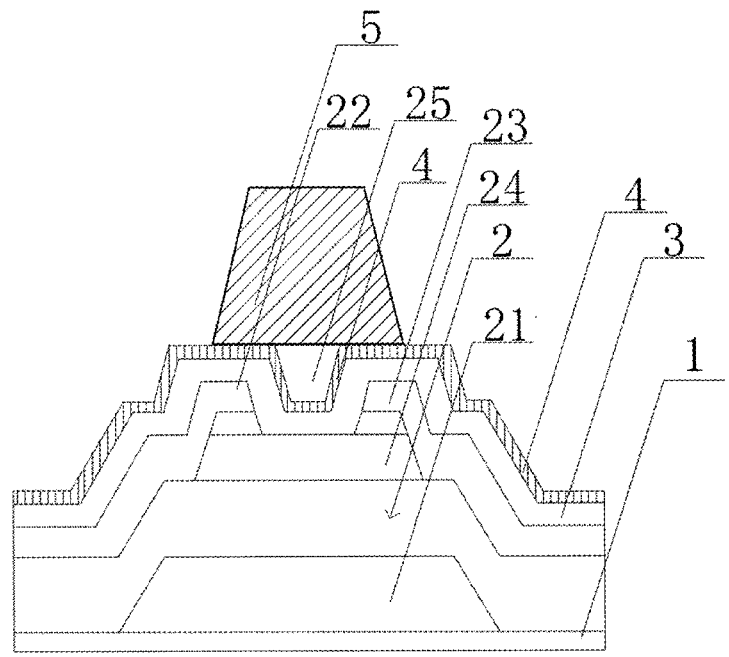
FIG. 4 is a schematically cross-sectional view showing a display panel according to another implementation of the embodiment of this disclosure.

As shown in FIG. 4, an active switch 2 includes a gate 21, the gate 21 is disposed on the substrate 1, an insulating layer is disposed on the gate 21, a semiconductor layer 24 corresponding to the gate 21 is disposed on the insulating layer, a source 22 and a drain 23 of the active switch 2 separated from each other are disposed on two ends of the semiconductor layer 24, a trench 25 is formed between the source 22 and the drain 23, and a bottom portion of the trench 25 is the semiconductor layer 24.

A protection layer 3 can effectively prevent the detergent from directly eroding the source 22 and the drain 23 of the display panel, so that the source 22 and the drain 23 can be kept intact, thereby decreasing the breaking problem, thus increasing the rework success rate of the array substrate having the active switch 2, and thus decreasing the scrapping cost. Because the source 22 and the drain 23 are made of a metal material, the micro-structures of the lateral sides of the source 22 and the drain 23 have the metal burr phenomenon. The provision of the protection layer 3 can better cover the metal burrs on the source 22 and the drain 23, and effectively prevent the metal burrs from being exposed outside the protection layer 3. Thus, the protection layer 3 can better protect the source 22 and the drain 23, effectively prevent the subsequent processes from affecting the source 22 and the drain 23, and thus effectively increase the yield of the display panel. The protection layer 3 may be configured in two layers, which are respectively a first protection layer and a second protection layer. The first protection layer covers the substrate 1, and the second protection layer covers the first protection layer to better cover the metal burrs on the metal layer. The first protection layer can effectively cover the metal burrs, and the second protection layer can effectively cover the metal burrs exposed from the first protection layer to effectively prevent the metal burrs from being exposed outside the protection layer 3. Thus, the protection layer 3 can better protect the metal layer, and can effectively prevent the detergent from directly eroding the metal layer of the display panel, so that the metal layer can be kept intact, and it is thus possible to prevent the breaking problem form occurring, and further increase the durability of the display panel. Meanwhile, the provision of the protection layer 3 can better increase the yield of the display panel, and the array substrate having the active switch 2 needs not to be scrapped, so that the green environment protection is further achieved.

A transparent electrode layer 4 is disposed between the spacer unit 5 and the active switch 2. The transparent electrode layer 4 can be effectively provided as long as the specific positions are exposed in the process mask design of the transparent electrode layer 4, thereby ensuring that the spacer unit 5 is better supported without changing the cost, and ensuring the better display quality of the display panel. Additional raw materials are not needed, the raw material cost and the storage cost are decreased, no new material needs to be added to the bill of materials, it is convenient to the flow manage and purchase, no additional apparatus for disposing the transparent electrode layer 4 is needed, one set of equipment apparatuses may be shared with the pixel electrode, and no additional equipment and material are required in the post etching.

The spacer unit 5 is disposed across the trench 25, so that the spacer unit 5 may be effectively supported on two ends of the trench 25, and the spacer unit 5 may be disposed on the transparent electrode layer 4 more stably, the displacement of the spacer unit 5 can be effectively prevented, and the liquid crystal of the liquid crystal box can be ensured to work effectively. Thus, the color and the brightness of the display panel are ensured to be further uniform, and the display effect of the display panel is further enhanced, so that the product competition ability is better enhanced. In addition, the transversal cross section of the spacer unit 5 has the tetragonal shape, and this can effectively prevent the spacer unit 5 from rolling, so that the spacer unit 5 can be effectively fixed onto the active switch 2, and the condition that the spherical spacer materials tend to gather can be overcome very well, thereby effectively preventing the bad point and the damage of the color filter, better protecting the color filter effectively and further increasing the durability of the display panel, so that the lifetime of the display panel becomes longer.

A width of one end of the spacer unit 5 contacting the transparent electrode layer 4 is greater than a width of the other end of the spacer unit. That is, the width of the bottom portion of the spacer unit 5 is greater than the width of the top portion thereof, so that the gate 21 is formed further conveniently, the molding gets stabler, the yield gets higher, and the contact area of the bottom portion of the spacer unit 5 gets larger to ensure the better bonding effect, so that the spacer unit 5 is fixed more firmly. The cross-section of the spacer unit 5 may be selected as a trapezoid, and more particularly as an isosceles trapezoid, so that the external force exerting on the spacer unit 5 to perform the extrusion action on the active switch 2 can be effectively decreased in the sections, such as the rear-section polarizer bonding process/thinning process/pressing test, thereby ensuring the better electric performance of the active switch 2, and effectively decreasing the lighting dark spot or pressing dark spot.

This implementation aspect discloses a display panel. The display panel includes a substrate, a transparent electrode layer and at least one spacer unit. The transparent electrode layer is disposed on the substrate; the spacer unit is disposed on the transparent electrode layer, and the spacer unit includes two different wavelengths of light initiators.

Figure 5:
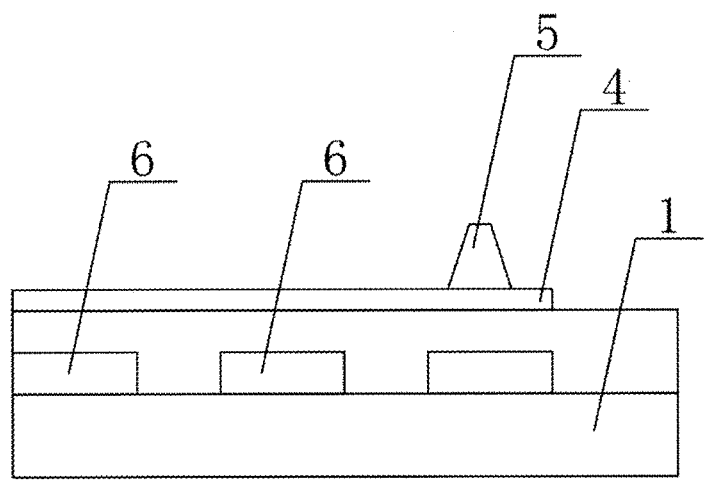
FIG. 5 is a schematically cross-sectional view showing a display panel according to another implementation of the embodiment of this disclosure.

Specifically, as shown in FIG. 5, the display panel includes the substrate 1; the color filter layer 6 is disposed on the substrate 1; the transparent electrode layer 4 covers the color filter layer 6; the spacer unit 5 is disposed on the transparent electrode layer 4; and the spacer unit 5 includes two different wavelengths of light initiators, and the substrate may be selected as the color filter substrate or the array substrate.

The spacer unit 5 includes two light initiators, and the spacer unit 5 includes the photosensitive spacer material with two light initiators. Accordingly, it is possible to adjust and control the shape and the size of the spacer unit 5 by adjusting to reduce the exposure energy without wasting the production cost of the mask under the half-tone mask conditions of different transmittance values. The precise transmittance design value can be obtained while the exposure energy can be controlled. The process production time can be effectively shortened and the testing cost can be decreased to better increase the production capacity and output of the display panel, thereby effectively simplifying the production process of the display panel, and obtaining the better production efficiency of the display panel. In addition, the height and the shape of the spacer unit 5 can be precisely controlled by precisely controlling the exposure energy and the illumination transmission to further enhance the high precision specification of the spacer unit 5, ensure the more precise height and the top and bottom areas of the spacer unit 5 and the better elastic recovery percentage, thus better hold the better uniformity of the inter-box gaps, better decrease the light-leakage condition of the display panel, and further enhance the contrast ratio of the display panel. Because the photosensitive spacer material has the higher hardness, the effective support performance can be ensured, and the liquid crystal in the liquid crystal box can work effectively, thereby ensuring the color and the brightness of the display panel to be further uniform, further enhancing the display effect of the display panel, better decreasing the influence on the electric property of the active switch 2, further improving the light dark spot so that the display effect of the display panel becomes better, and further enhancing the display quality of the display panel. The photosensitive spacer material has the good thermal resistance and the excellent chemical resistance, thereby ensuring the display panel to work very well and further ensuring the quality of the display panel. The spacer unit 5 has the high transmission and contrast ratio, thereby ensuring the color and the brightness of the display panel to be further uniform, and effectively enhancing the quality of the display panel. Meanwhile, the good adhesive force is present between the spacer unit 5 and the transparent electrode layer 4, the spacer unit 5 is better fixed, thereby effectively preventing the displacement of the spacer unit 5, ensuring the liquid crystal in the liquid crystal box to work effectively, thus ensuring the color and brightness of the display panel to be further uniform and further enhancing the display effect of the display panel, so that the product competition ability is better enhanced. The photosensitive spacer material is a polymeric resin mixture having the photosensitivity, and the manufacturing method includes: coating the photosensitive spacer material onto the transparent electrode layer 4; performing the steps of exposure, development, baking and the like to obtain the spacer units 5 with the desired thickness and shape; and then directly bonding the substrate 1 having the spacer units 5 to another substrate so that the liquid crystal box is formed between the two spacer units 5. Controlling the shape of the spacer unit 5 by way of lithographing, controlling the shape of the mask and controlling the illumination time can thus effectively control the thickness and the shape of the spacer unit 5, ensure that the spacer unit 5 can provide the effective support performance, effectively improve the deformation of the active switch 2 when the external force is exerted on the spacer unit 5 in the subsequent process, can better decrease the influence on the electric property of the active switch 2, further improve the light dark spot so that the display effect of the display panel becomes better, and further enhance the display quality of the display panel.

Figure 6:
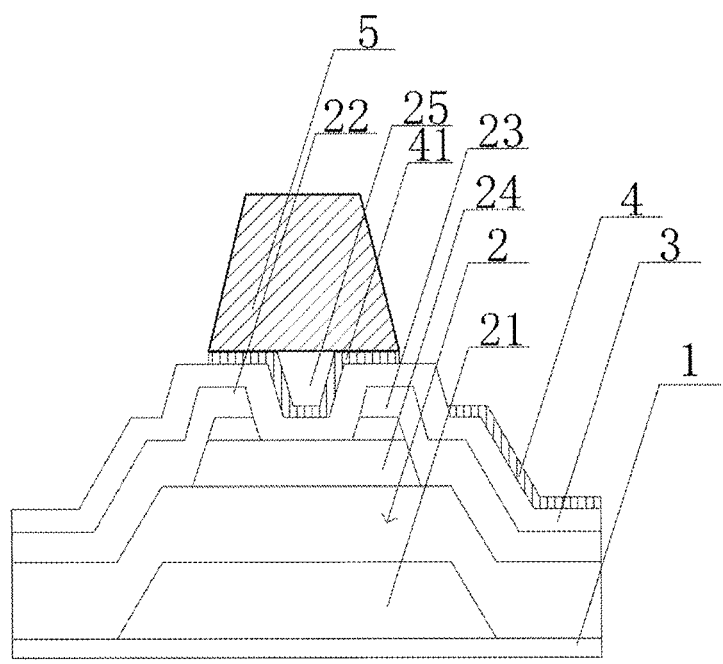
FIG. 6 is a schematically cross-sectional view showing a display panel according to another implementation of the embodiment of this disclosure.

As shown in FIG. 6, the implementation aspect discloses a display panel including the substrate 1, the active switch 2 disposed on the substrate 1, the protection layer 3 disposed on and covering the active switch 2, the spacer unit 5 disposed above the active switch 2 and on the protection layer 3, and a first transparent electrode layer 41 disposed between the opposite facing surfaces of the spacer unit 5 and the protection layer 3. The first transparent electrode layer 41 is disposed in the orthogonally projected region of the protection layer 3 along the spacer unit 5 and can effectively provide the support action while effectively saving the consumable material. This is beneficial to the further decrease of the manufacturing cost of the display panel, effectively enhance the product competitiveness of the display panel, effectively support the spacer unit 5, and effectively reduce the deformation of the active switch 2 when the external force is exerted on the spacer unit 5 in the subsequent process. This disclosure can better decrease the influence on the electric property of the active switch 2, further improve the light dark spot so that the display effect of the display panel becomes better, and further enhance the display quality of the display panel.

The spacer unit 5 is disposed across the trench 25, so that the spacer unit 5 may be effectively supported on two ends of the trench 25, and the spacer unit 5 may be disposed on the first transparent electrode layer 41 more stably, the displacement of the spacer unit 5 can be effectively prevented, and the liquid crystal of the liquid crystal box can be ensured to work effectively. Thus, the color and the brightness of the display panel are ensured to be further uniform, and the display effect of the display panel is further enhanced, so that the product competition ability is better enhanced. In addition, the transversal cross section of the spacer unit 5 has the tetragonal shape, and this can effectively prevent the spacer unit 5 from rolling, so that the spacer unit 5 can be effectively fixed onto the active switch 2, and the condition that the spherical spacer materials tend to gather can be overcome very well, thereby effectively preventing the bad point and the damage of the color filter, better protecting the color filter effectively and further increasing the durability of the display panel, so that the lifetime of the display panel becomes longer.

A width of one end of the spacer unit 5 contacting the first transparent electrode layer 41 is greater than a width of the other end of the spacer unit. That is, the width of the bottom portion of the spacer unit 5 is greater than the width of the top portion thereof, so that the gate 21 is formed further conveniently, the molding gets stabler, the yield gets higher, and the contact area of the bottom portion of the spacer unit 5 gets larger to ensure the better bonding effect, so that the spacer unit 5 is fixed more firmly. The cross-section of the spacer unit 5 may be selected as a trapezoid, and more particularly as an isosceles trapezoid, so that the external force exerting on the spacer unit 5 to perform the extrusion action on the active switch 2 can be effectively decreased in the sections, such as the rear-section polarizer bonding process/thinning process/pressing test, thereby ensuring the better electric performance of the active switch 2, and effectively decreasing the lighting dark spot or pressing dark spot.

Figure 7:
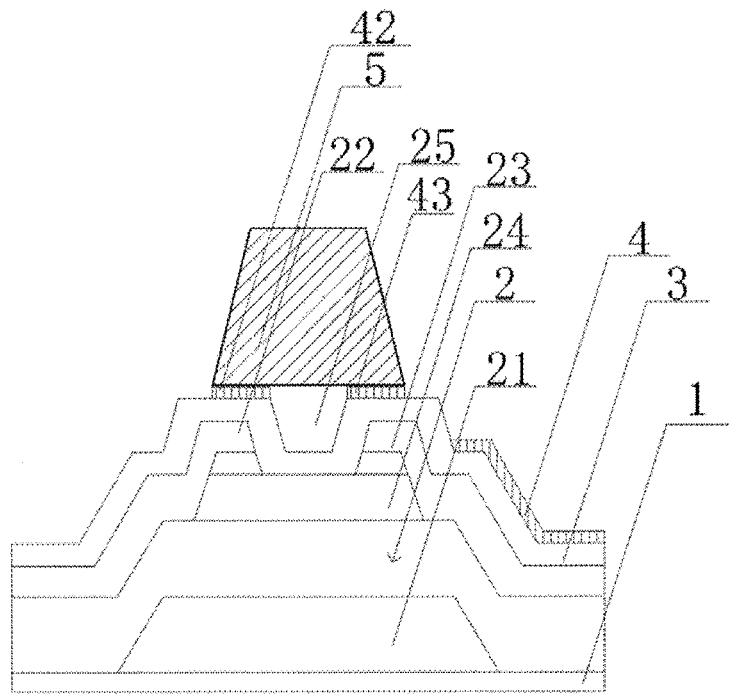
FIG. 7 is a schematically cross-sectional view showing a display panel according to another implementation of the embodiment of this disclosure.

As shown in FIG. 7, the implementation aspect discloses a display panel including the substrate 1, the active switch 2 disposed on the substrate 1, the protection layer 3 disposed on and covering the active switch 2, the spacer unit 5 disposed above the active switch 2 and on the protection layer 3, and the transparent electrode layer 4 disposed between the opposite facing surfaces of the spacer unit 5 and the protection layer 3. The transparent electrode layer 4 includes a second transparent electrode layer 42 and a third transparent electrode layer 43. The trench 25 is formed between the second transparent electrode layer 42 and the third transparent electrode layer 43. The second transparent electrode layer 42 is disposed on the protection layer 3 above the source 22. The third transparent electrode layer 43 is disposed on the protection layer 3 above the drain 23. The second transparent electrode layer 42 and the third transparent electrode layer 43 support the spacer unit 5. This disclosure can effectively support the spacer unit 5, effectively reduce the deformation of the active switch 2 when the external force is exerted on the spacer unit 5 in the subsequent process, better decrease the influence on the electric property of the active switch 2, further improve the light dark spot so that the display effect of the display panel becomes better, and further enhance the display quality of the display panel. In addition, such the transparent electrode layer 4 disposed on two ends of the trench 25 can effectively reduce the manufacturing difficulty. Only the specific positions are exposed in the process mask design of the transparent electrode layer 4, thereby ensuring that the spacer unit 5 is better supported without changing the cost, and ensuring the better display quality of the display panel. Additional raw materials are not needed, the raw material cost and the storage cost are decreased, no new material needs to be added to the bill of materials, it is convenient to the flow manage and purchase, no additional apparatus for disposing the transparent electrode layer 4 is needed, and no additional equipment and material are required in the post etching.

The spacer unit 5 is disposed across the trench 25, so that the spacer unit 5 may be effectively supported on two ends of the trench 25, and the spacer unit 5 may be disposed on the transparent electrode layer 4 more stably, the displacement of the spacer unit 5 can be effectively prevented, and the liquid crystal of the liquid crystal box can be ensured to work effectively. Thus, the color and the brightness of the display panel are ensured to be further uniform, and the display effect of the display panel is further enhanced, so that the product competition ability is better enhanced. In addition, the transversal cross section of the spacer unit 5 has the tetragonal shape, and this can effectively prevent the spacer unit 5 from rolling, so that the spacer unit 5 can be effectively fixed onto the active switch 2, and the condition that the spherical spacer materials tend to gather can be overcome very well, thereby effectively preventing the bad point and the damage of the color filter, better protecting the color filter effectively and further increasing the durability of the display panel, so that the lifetime of the display panel becomes longer.

In the above embodiments, the material of the substrate 1 is selected from glass, plastic transparent material, and the likes.

In the above embodiments, for example, a liquid crystal display panel comprises a TFT substrate and a CF substrate, and the TFT substrate and the CF substrate are disposed opposite to each other. Liquid crystal molecules and spacer units are disposed between the TFT substrate and the CF substrate. The TFT substrate are configured with active switches, and the active switches are, for example, thin-film transistors (TFT). The CF substrate is configured with a color photoresist layer. The color photoresist layer and the active switches can be formed on the same substrate.

In some embodiments, the display panel can be a liquid crystal display panel, an OLED display panel, a QLED display panel, a plasma display panel, a flat display panel, a curved display panel, or the likes, and this disclosure is not limited.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A manufacturing method of a display panel, comprising:
   providing a first substrate;
   forming active switches on the first substrate;
   providing a second substrate disposed opposite to the first substrate;
   forming a color filter layer on the first substrate or the second substrate; and
   forming at least one spacer unit on the first substrate or the second substrate;
   wherein the spacer unit comprises a photosensitive spacer material comprising two different wavelengths of light initiators, solvent, adhesive, monomer, oligomer, and additive,
   wherein the light initiators comprise a long wavelength light initiator and a short wavelength light initiator, the long wavelength light initiator and the short wavelength light initiator are selected from acyl phosphorous oxide, benzoin ether, benzoin dimethyl ether, didodecylbenzene iodonium salt, thiophenyl monooxazinone, Irgacure 500, and Gencure 907,
   wherein a component ratio of the solvent is 60%~80%,
   wherein a component ratio of the adhesive is 10%~20%,
   wherein a component ratio of the oligomer is less than 1%.

2. The manufacturing method according to claim 1, wherein a component ratio of the monomer is 10%~15%.

3. The manufacturing method according to claim 1, wherein the monomer comprises a photoactive monomer.

4. The manufacturing method according to claim 3, wherein the photoactive monomer is an acrylic polymer or an epoxy polymer.

5. The manufacturing method according to claim 1, wherein a component ratio of the long wavelength light initiator is 2%~4%, and a component ratio of the short wavelength light initiator is 1%.

6. The manufacturing method according to claim 1, wherein a component ratio of the additive is less than 1%.

7. The manufacturing method according to claim 1, wherein the additive comprises activator, antioxidant, deflocculant, dispersant, leveling agent, or stabilizer, or any of combinations thereof.

8. A manufacturing method of a display panel, comprising:
   providing a first substrate;
   forming active switches on the first substrate;
   providing a second substrate disposed opposite to the first substrate;
   forming a color filter layer on the first substrate or the second substrate; and
   forming at least one spacer unit on the first substrate or the second substrate;
   wherein the spacer unit comprises a photosensitive spacer material comprising two different wavelengths of light initiators; the photosensitive spacer material comprises solvent, adhesive, monomer, oligomer, light initiator, and additive; a component ratio of the solvent is 60%~80%; a component ratio of the adhesive is 10%~20%; a component ratio of the monomer is 10%~15%; and a component ratio of the oligomer is less than 1%,
   wherein the light initiators comprise a long wavelength light initiator and a short wavelength light initiator, and the long wavelength light initiator and the short wavelength light initiator are selected from acyl phosphorous oxide, benzoin ether, benzoin dimethyl ether, didodecylbenzene iodonium salt, thiophenyl monooxazinone, Irgacure 500, and Gencure 907.

9. The manufacturing method according to claim 8, wherein a component ratio of the long wavelength light initiator is 2%~4%, and a component ratio of the short wavelength light initiator is 1%.

10. The manufacturing method according to claim 8, wherein a component ratio of the additive is less than 1%.

11. The manufacturing method according to claim 8, wherein the monomer comprises a photoactive monomer.

12. The manufacturing method according to claim 11, wherein the photoactive monomer is an acrylic polymer or an epoxy polymer.

13. The manufacturing method according to claim 8, wherein the additive comprises the additive comprises activator, antioxidant, deflocculant, dispersant, leveling agent, or stabilizer, or any of combinations thereof.

14. A display panel, comprising:
a first substrate comprising active switches disposed thereon;
a second substrate disposed opposite to the first substrate; and
a color filter layer disposed on the first substrate or the second substrate;
wherein at least one spacer unit is formed on the first substrate or the second substrate, and the spacer unit comprises a photosensitive spacer material comprising two different wavelengths of light initiators, solvent, adhesive, monomer, oligomer, and additive,
wherein the light initiators comprise a long wavelength light initiator and a short wavelength light initiator, the long wavelength light initiator and the short wavelength light initiator are selected from acyl phosphorous oxide, benzoin ether, benzoin dimethyl ether, didodecylbenzene iodonium salt, thiophenyl monooxazinone, Irgacure 500, and Gencure 907,
wherein a component ratio of the solvent is 60%~80%,
wherein a component ratio of the adhesive is 10%~20%,
wherein a component ratio of the oligomer is less than 1%.

15. The display panel according to claim 14, wherein a component ratio of the monomer is 10%~15%.

16. The display panel according to claim 15, wherein a component ratio of the long wavelength light initiator is 2%~4%, and a component ratio of the short wavelength light initiator is 1%.

* * * * *